United States Patent
Choi (10) Patent No.: US 10,845,408 B2
(45) Date of Patent: Nov. 24, 2020

(54) WAFER BURN-IN TEST CIRCUIT AND SEMICONDUCTOR MEMORY INCLUDING THE SAME

(71) Applicant: SK hynix Inc., Icheon-si (KR)

(72) Inventor: Young Jae Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/440,713

(22) Filed: Jun. 13, 2019

(65) Prior Publication Data

US 2019/0293712 A1   Sep. 26, 2019

Related U.S. Application Data

(62) Division of application No. 15/462,408, filed on Mar. 17, 2017, now Pat. No. 10,352,993.

(30) Foreign Application Priority Data

Nov. 1, 2016 (KR) .......................... 10-2016-0144526

(51) Int. Cl.
| | | |
|---|---|---|
| *G11C 7/00* | (2006.01) | |
| *G01R 31/28* | (2006.01) | |
| *G11C 29/00* | (2006.01) | |
| *G11C 29/02* | (2006.01) | |
| *G11C 5/02* | (2006.01) | |

(52) U.S. Cl.
CPC .......... *G01R 31/2856* (2013.01); *G11C 5/025* (2013.01); *G11C 29/006* (2013.01); *G11C 29/023* (2013.01); *G11C 29/028* (2013.01)

(58) Field of Classification Search
CPC ..... G11C 5/025; G11C 29/006; G11C 29/023; G11C 29/028; G01R 31/2856
USPC ......................................................... 365/201
See application file for complete search history.

(56) References Cited

U.S. PATENT DOCUMENTS

| | | |
|---|---|---|
| 5,249,155 A | 9/1993 | Krimoto et al. |
| 5,345,422 A | 9/1994 | Redwine |
| 5,390,129 A | 2/1995 | Rhodes |
| 5,424,990 A | 6/1995 | Dhsawa |
| 5,815,512 A | 9/1998 | Osawa et al. |
| 6,122,760 A * | 9/2000 | Grosch .............. G01R 31/2879 714/724 |
| 6,259,638 B1 * | 7/2001 | Kim ...................... G11C 29/34 365/201 |
| 6,453,258 B1 | 9/2002 | Aoki et al. |

(Continued)

FOREIGN PATENT DOCUMENTS

KR    1020090046384 A    5/2009

*Primary Examiner* — Viet Q Nguyen
(74) *Attorney, Agent, or Firm* — William Park & Associates Ltd.

(57) ABSTRACT

A wafer burn-in test circuit may be provided. The wafer burn-in test circuit may include a timing correction unit configured to generate a plurality of timing-compensated input signals by synchronizing a plurality of pulse signals generated according to a plurality of input signals with an input signal among the plurality of input signals. The wafer burn-in test circuit may include a wafer burn-in signal decoding unit configured to generate a plurality of decoding signals by decoding the plurality of timing-compensated input signals and output the plurality of decoding signals as a plurality of wafer burn-in signals by latching the plurality of decoding signals.

11 Claims, 10 Drawing Sheets

(56) References Cited

U.S. PATENT DOCUMENTS

| | | | |
|---|---|---|---|
| 6,574,760 B1 | 6/2003 | Mydill | |
| 7,016,248 B2* | 3/2006 | Park | G11C 5/145 |
| | | | 327/374 |
| 7,134,059 B2* | 11/2006 | Jeon | G11C 7/1012 |
| | | | 714/718 |
| 7,173,872 B2* | 2/2007 | Park | G11C 5/145 |
| | | | 327/374 |
| 8,014,214 B2* | 9/2011 | Kang | G11C 29/48 |
| | | | 365/189.07 |
| 8,804,444 B2* | 8/2014 | Cho | G11C 29/20 |
| | | | 365/201 |
| 8,854,073 B2* | 10/2014 | Grosch | G01R 31/3004 |
| | | | 324/750.3 |
| 9,251,912 B2* | 2/2016 | Lee | G11C 29/24 |
| 9,397,672 B2* | 7/2016 | Shim | G11C 29/023 |
| 9,664,736 B2* | 5/2017 | Seah | G01R 31/2894 |
| 9,851,401 B2* | 12/2017 | Kim | G11C 29/00 |
| 10,001,525 B2* | 6/2018 | Kang | G11C 29/40 |
| 10,248,520 B2* | 4/2019 | Vahidsafa | G06F 11/25 |
| 10,352,993 B2* | 7/2019 | Choi | G01R 31/2856 |
| 2001/0045570 A1 | 11/2001 | Kitade et al. | |
| 2007/0046590 A1 | 3/2007 | Umezaki et al. | |
| 2011/0045570 A1* | 2/2011 | Lu | C12N 9/52 |
| | | | 435/220 |
| 2015/0155054 A1 | 6/2015 | Lee et al. | |
| 2015/0235687 A1* | 8/2015 | Choi | G11C 8/12 |
| | | | 365/201 |

\* cited by examiner

WAFER BURN-IN TEST CIRCUIT AND SEMICONDUCTOR MEMORY INCLUDING THE SAME

CROSS-REFERENCES TO RELATED APPLICATION

The present application is a divisional application of U.S. patent application Ser. No. 15/462,408, filed on Mar. 17, 2017, and claims priority under 35 U.S.C. § 119(a) to Korean application number 10-2016-0144526, filed on Nov. 1, 2016, in the Korean Intellectual Property Office, which is incorporated herein by reference in its entirety.

BACKGROUND

1. Technical Field

Various embodiments may generally relate to a system, and more particularly, to a wafer burn-in test circuit and a semiconductor memory including the wafer burn-in test circuit.

2. Related Art

Various tests on semiconductor apparatuses may be performed. These tests are performed to determine whether or not the semiconductor apparatuses are operating normally.

One test that may be performed, is a wafer burn-in test. The wafer burn-in test may test whether or not the semiconductor apparatus is operating normally by applying stress to various circuit components while the semiconductor apparatus is in a wafer state. The wafer bur-in test may be an important test to determine whether or not the semiconductor apparatus is operating normally.

SUMMARY

In an embodiment of the present disclosure, a semiconductor memory may be provided. The semiconductor memory may include a wafer burn-in test circuit. In an embodiment of the present disclosure, a wafer burn-in test circuit may be provided. The wafer burn-in test circuit may include a timing correction unit configured to generate a plurality of timing-compensated input signals by synchronizing a plurality of pulse signals generated according to a plurality of input signals with an input signal among the plurality of input signals. The wafer burn-in test circuit may include a wafer burn-in signal decoding unit configured to generate a plurality of decoding signals by decoding the plurality of timing-compensated input signals and output the plurality of decoding signals as a plurality of wafer burn-in signals by latching the plurality of decoding signals.

DETAILED DESCRIPTION

Various embodiments of the present disclosure will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present description is described herein with reference to cross-section and/or plan illustrations of idealized embodiments. However, the embodiments should not be construed as limiting the concepts described herein. Although a few embodiments will be illustrated and described, it will be appreciated by those of ordinary skill in the art that changes may be made in these embodiments without departing from the principles and spirit of the present disclosure.

Various embodiments may be provided for a wafer burn-in test circuit capable of reducing a wafer burin-in test time and a circuit area for a test and a semiconductor memory including the same.

A memory system 100 according to an embodiment may be implemented in a form of system in package (SIP), multichip package (MCP), or system on chip (SOC) or in a form of package on package (POP) including a plurality of packages.

Figure 1:
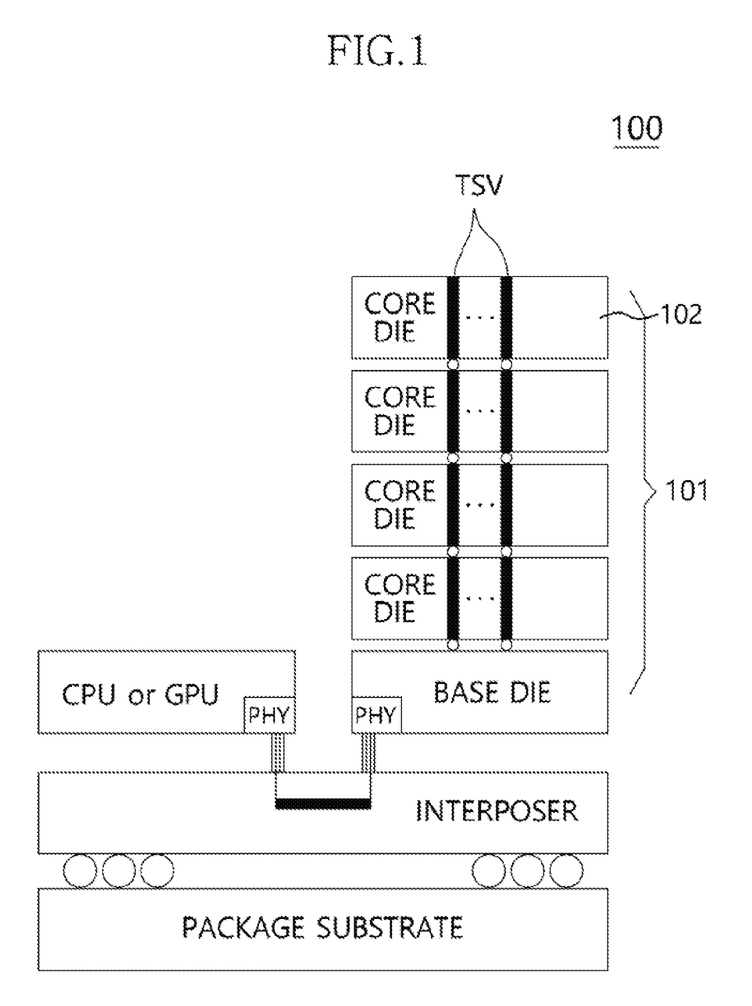
FIG. 1 is a diagram illustrating a representation of an example of a configuration of a memory system according to an embodiment of the present disclosure.

Referring to FIG. 1, the memory system 100 according to an embodiment may include a semiconductor memory 101 (for example, a stacked semiconductor memory 101 in which a plurality of dies are stacked), a memory controller (for example, central processing unit (CPU) or graphics processing unit (GPU)), an interposer, and a package substrate.

The semiconductor memory 101 may be configured in a high bandwidth memory (HBM) form having a structure that a plurality of dies are stacked and electrically coupled through a through electrode and thus the number of input and output (input/output) (I/O) units is increased and the bandwidth is increased.

The interposer may be disposed over the package substrate to be coupled thereto.

The stacked semiconductor memory 101 and the memory controller (CPU or GPU) may be disposed over the interposer to be coupled thereto.

Physical regions PHY of the stacked semiconductor memory 101 and the memory controller (CPU or GPU) may be coupled through the interposer.

The stacked semiconductor memory 101 may be configured of a plurality of dies stacked.

The plurality of dies may include a base die and a plurality of core dies.

The base die and the plurality of core dies may be electrically coupled through a plurality of through electrodes, for example, through silicon vias (TSVs).

Figure 2:
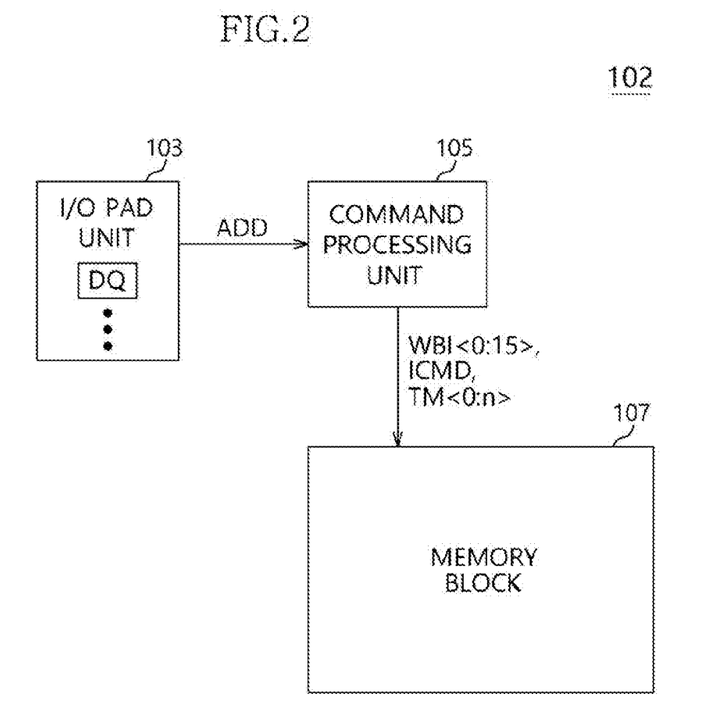
FIG. 2 is a diagram illustrating a representation of an example of a configuration of a semiconductor memory of FIG. 1.

Referring to FIG. 2, a semiconductor memory 102, for example, any one of the stacked semiconductor memory 101 of FIG. 1 may include an I/O pad unit 103, a command processing unit 105, and a memory block 107.

The I/O pad unit 103 may include a plurality of pads DQ.

The command processing unit 105 may generate a plurality of wafer burn-in signals WBI<0:15>, internal commands ICMD, and a plurality of test mode signals TM<0:n> by receiving an address signal ADD through the plurality of pads DQ of the I/O pad unit 103.

The plurality of wafer burn-in signals WBI<0:15> to be described later may be signals for performing a wafer burn-in test by controlling an on and off (on/off) operation of internal circuit components of the memory block 107, for example, a sense amplifier, a driver, a buffer, and the like. In an embodiment, the wafer burnin-control unit 210 may be configured to receive a portion of an address signal ADD input through the I/O pad unit 103 as a plurality of input signals IN<0:3> and generate a plurality of wafer burn-in signals WBI<0:15> according to a plurality of timing-compensated input signals IN_RE<0:3> generated by arranging the plurality of input signals IN<0:3> in conformity with an input signal having a latest transition timing among the plurality of input signals IN<0:3>.

The memory block 107 may perform a normal operation, for example, read, write, precharge, and the like according to the internal commands ICMD.

The memory block 107 may perform various tests other than the wafer burn-in test by entering various test modes related to data written and read according to the plurality of test mode signals TM<0:n>.

Figure 3:
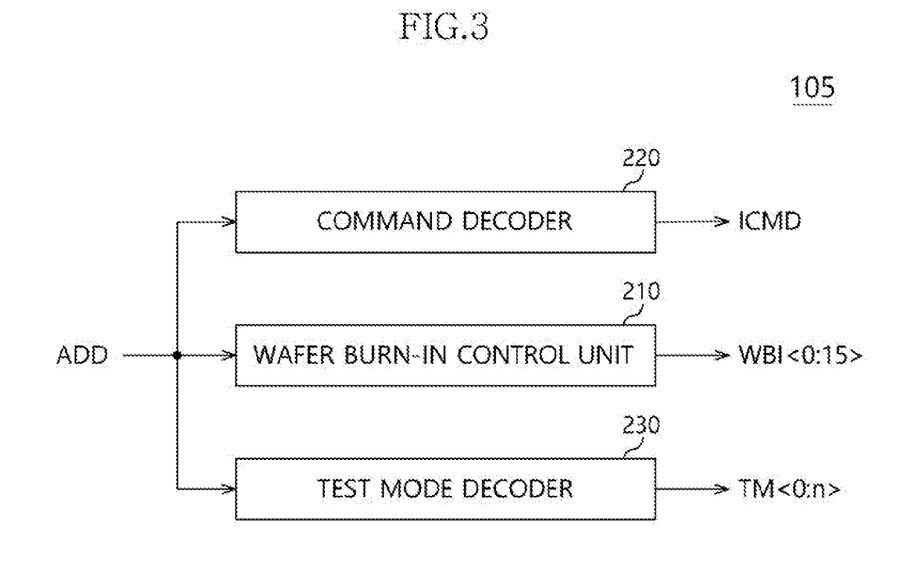
FIG. 3 is a diagram illustrating a representation of an example of a configuration of a command processing circuit of FIG. 2.

Referring to FIG. 3, the command processing unit 105 may include a wafer burn-in control unit 210, a command decoder 220, and a test mode decoder 230.

The wafer burn-in control unit 210 may generate the plurality of wafer burn-in signals WBI<0:15> by receiving the address signal ADD.

The command decoder 220 may generate the internal commands ICMD, for example, an active command, a read command, a write command, and the like by receiving the address signal ADD.

The test mode decoder 230 may generate the plurality of test mode signals TM<0:n> by receiving the address signal ADD.

Figure 4:
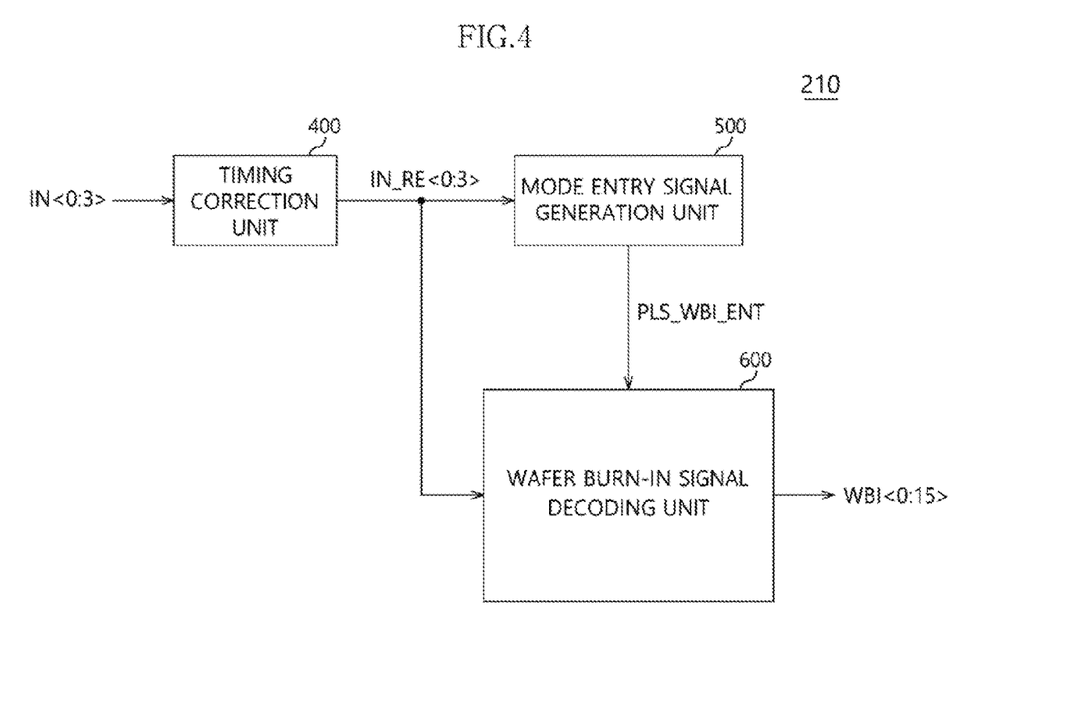
FIG. 4 is a diagram illustrating a representation of an example of a configuration of a wafer burn-in control unit of FIG. 3.

Referring to FIG. 4, the wafer burn-in control unit 210 may include a timing correction unit 400, a mode entry signal generation unit 500, and a wafer burn-in signal decoding unit 600.

The timing correction unit 400 may generate a plurality of timing-compensated input signals IN_RE<0:3> by synchronizing a plurality of pulse signals generated according to a plurality of input signals IN<0:3> with an input signal having a latest transition timing among the plurality of input signals IN<0:3>.

The mode entry signal generation unit 500 may generate a mode entry signal PLS_WBI_ENT according to the plurality of timing-compensated input signals IN_RE<0:3>.

The wafer burn-in signal decoding unit 600 may generate decoding signals by decoding the plurality of timing-compensated input signals IN_RE<0:3> and output the decoding signals as the plurality of wafer burn-in signals WBI<0:15> by latching the decoding signals according to the mode entry signal PLS_WBI_ENT.

The wafer burn-in signal decoding unit 600 may initialize levels of the plurality of wafer burn-in signals WBI<0:15> according to the plurality of timing-compensated input signals IN_RE<0:3>.

Figure 5:
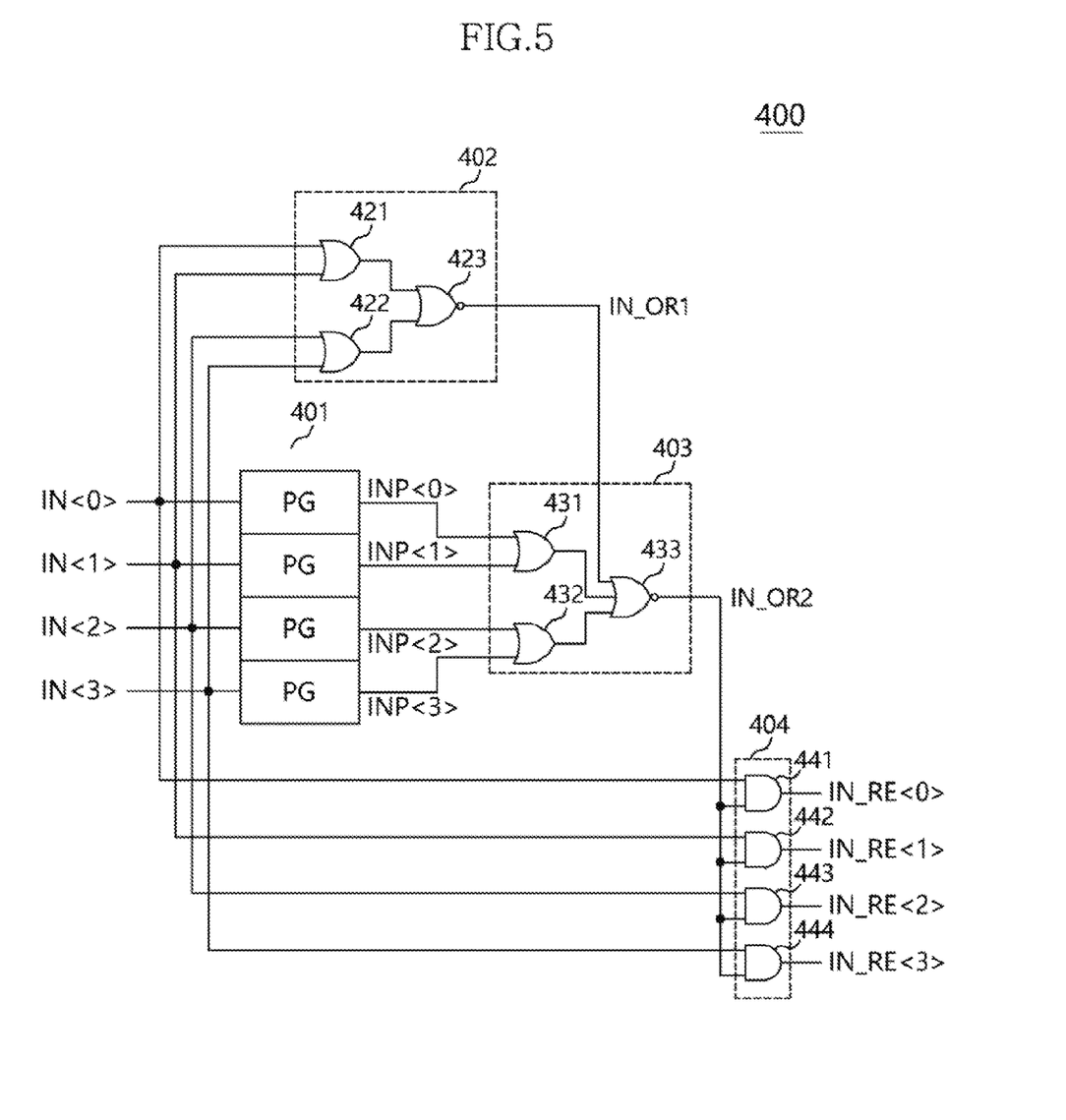
FIG. 5 is a diagram illustrating a representation of an example of a configuration of a timing correction unit of FIG. 4.

Referring to FIG. 5, the timing correction unit 400 may include a plurality of pulse generators (PG) 401, combination circuits 402 and 403, and an arrangement circuit 404.

The plurality of pulse generators 401 may generate a plurality of pulse signals INP<0:3> by detecting transitions of the plurality of input signals IN<0:3>.

A first combination circuit 402 of the combination circuits 402 and 403 may generate an output signal IN_OR1 by combining the plurality of input signals IN<0:3>.

The first combination circuit 402 may include first to third logic gates 421 to 423.

The first logic gate 421 may perform a logic OR operation on portions IN<0:1> of the plurality of input signals IN<0:3> and output a logic OR operation result.

The second logic gate 422 may perform a logic OR operation on portions IN<2:3> of the plurality of input signals IN<0:3> and output a logic OR operation result.

The third logic gate 423 may generate the output signal IN_OR1 by performing a logic NOR operation on an output of the first logic gate 421 and an output of the second logic gate 422.

A second combination circuit 403 of the combination circuits 402 and 403 may generate an output signal IN_OR2 by combining the plurality of pulse signals INP<0:3>.

The second combination circuit 403 may include first to third logic gates 431 to 433.

The first logic gate 431 may perform a logic OR operation on portions INP<0:1> of the plurality of pulse signals INP<0:3> and output a logic OR operation result.

The second logic gate 432 may perform a logic OR operation on portions INP<2:3> of the plurality of pulse signals INP<0:3> and output a logic OR operation result.

The third logic gate 433 may generate the output signal IN_OR2 by performing a logic NOR operation on the output signal IN_OR1 of the first combination circuit 402, an output of the first logic gate 431, and an output of the second logic gate 432.

The arrangement circuit 404 may output the plurality of timing-compensated input signals IN_RE<0:3> by arranging the plurality of input signals IN<0:3> according to the output signal IN_OR2 of the second combination circuit 403.

The arrangement circuit 404 may include first to fourth logic gates 441 to 444.

The first logic gate 441 may perform a logic AND operation on one IN<0> of the plurality of input signals IN<0:3> and the output signal IN_OR2 of the second combination circuit 403 and output the logic AND operation result as one IN_RE<0> of the plurality of timing-compensated input signals IN_RE<0:3>.

The second logic gate 442 may perform a logic AND operation on one IN<1> of the plurality of input signals IN<0:3> and the output signal IN_OR2 of the second combination circuit 403 and output the logic AND operation result as one IN_RE<1> of the plurality of timing-compensated input signals IN_RE<0:3>.

The third logic gate 443 may perform a logic AND operation on one IN<2> of the plurality of input signals IN<0:3> and the output signal IN_OR2 of the second combination circuit 403 and output the logic AND operation result as one IN_RE<2> of the plurality of timing-compensated input signals IN_RE<0:3>.

The fourth logic gate 444 may perform a logic AND operation on one IN<3> of the plurality of input signals IN<0:3> and the output signal IN_OR2 of the second combination circuit 403 and output the logic AND operation result as one IN_RE<3> of the plurality of timing-compensated input signals IN_RE<0:3>.

Figure 6:
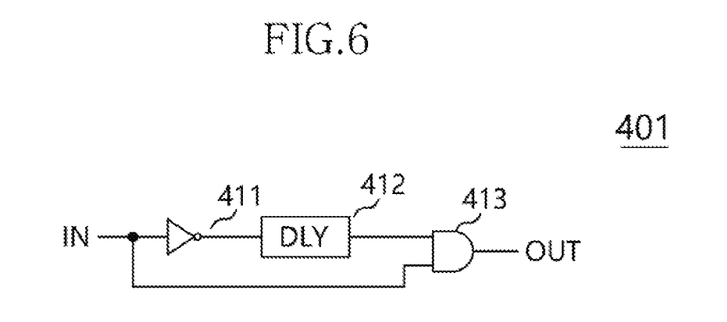
FIG. 6 is a diagram illustrating a representation of an example of a configuration of a pulse generator of FIG. 5.

Referring to FIG. 6, each of the plurality of pulse generators (PG) 401 of FIG. 5 may include first to third logic gates 411 to 413.

The first logic gate 411 may invert the input signal IN and output an inverted input signal.

The second logic gate 412 may delay (i.e., DLY) an output of the first logic gate 411 by a preset time and output the delayed signal.

The third logic gate 413 may perform a logic AND operation on an output of the second logic gate 412 and the input signal IN and output the logic AND operation result as an output signal OUT, for example, the pulse signal INP.

The pulse generator (PG) 401 may generate the output signal OUT having a pulse width corresponding to the delay time set in the logic gate 412 according to the transition of the input signal IN from logic low to logic high.

Figure 7:
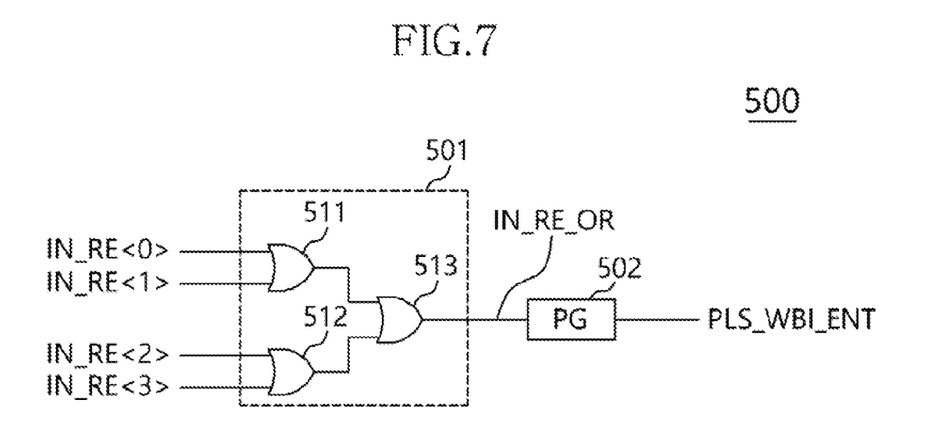
FIG. 7 is a diagram illustrating a representation of an example of a configuration of a mode entry signal generation unit of FIG. 4.

Referring to FIG. 7, the mode entry signal generation unit 500 may include a first combination circuit 501 and a pulse generator (PG) 502.

The mode entry signal generation unit 500 may generate a combination signal IN_RE_OR by combining the plurality of timing-compensated input signals IN_RE<0:3> and generate the mode entry signal PLS_WBI_ENT by detecting the transition of the combination signal IN_RE_OR.

The first combination circuit 501 may generate the combination signal IN_RE_OR by combining the plurality of timing-compensated input signals IN_RE<0:3>.

The first combination circuit 501 may include first to third logic gates 511 to 513.

The first logic gate 511 may perform a logic OR operation on the portions IN_RE<0:1> of the plurality of timing-compensated input signals IN_RE<0:3> and output the logic OR operation result.

The second logic gate 512 may perform a logic OR operation on the portions IN_RE<2:3> of the plurality of timing-compensated input signals IN_RE<0:3> and output the logic OR operation result.

The third logic gate 513 may generate the combination signal IN_RE_OR by performing a logic OR operation on an output of the first logic gate 511 and an output of the second logic gate 512.

The pulse generator 502 may generate the mode entry signal PLS_WBI_ENT by detecting the transition of the combination signal IN_RE_OR.

The pulse generator 502 may have the same configuration as that of the pulse generator 401 of FIG. 6.

Figure 8:
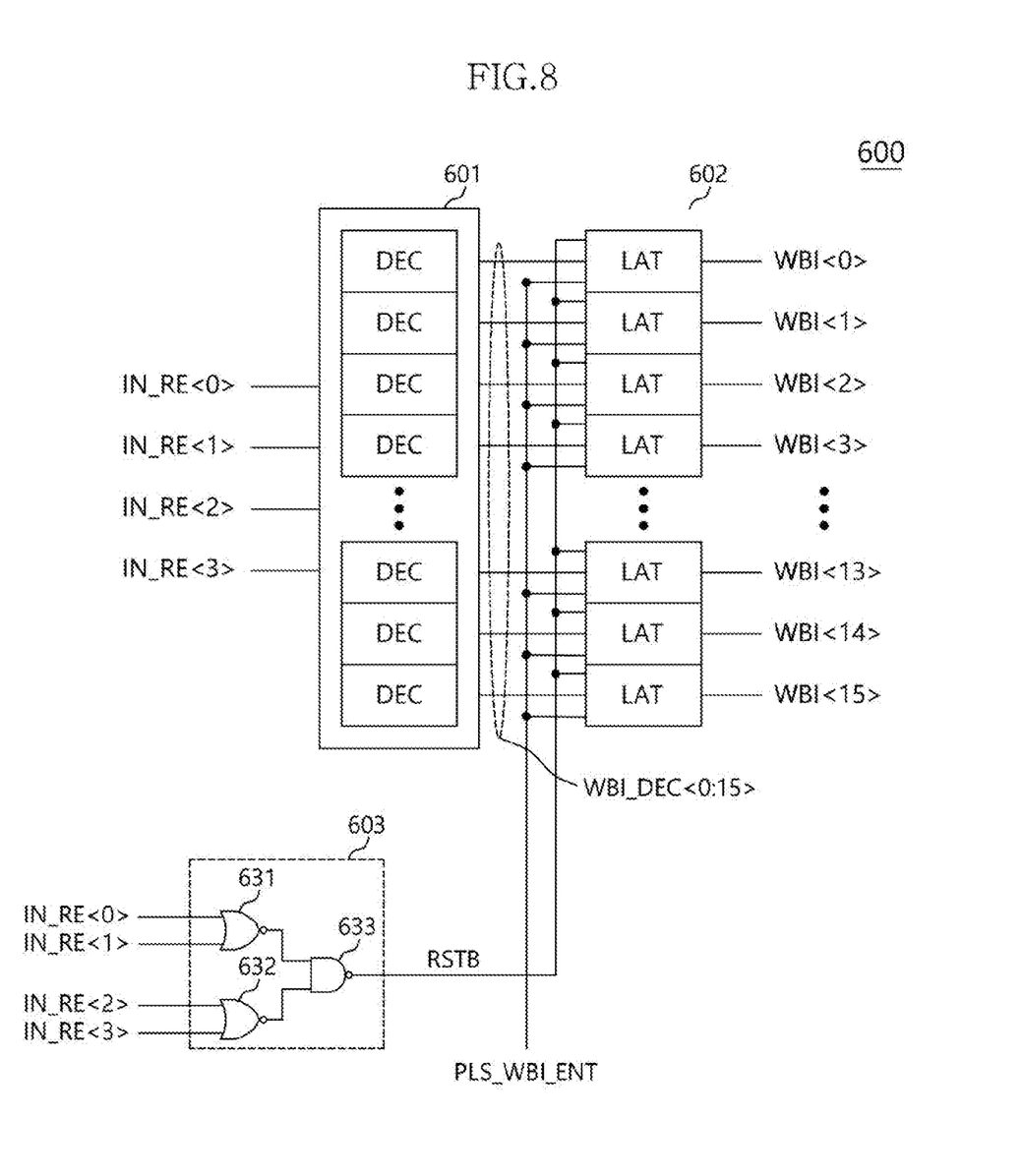
FIG. 8 is a diagram illustrating a representation of an example of a configuration of a wafer burn-in signal decoding unit of FIG. 4.

Referring to FIG. 8, the wafer burn-in signal decoding unit 600 may include a plurality of decoders (DEC) 601, a plurality of latches (LAT) 602, and a reset signal generation unit 603.

The plurality of decoders 601 may generate a plurality of decoding signals WBI_DEC<0:15> by decoding the plurality of timing-compensated input signals IN_RE<0:3>.

The plurality of latches 602 may latch the plurality of decoding signals WBI_DEC<0:15> according to the mode entry signal PLS_WBI_ENT and output the latched decoding signals as the plurality of wafer burn-in signals WBI<0:15>.

The plurality of latches 602 may initialize logic levels of the plurality of wafer burn-in signals WBI<0:15>, for example, to logic low as a reset signal RSTB is activated.

The reset signal generation unit 603 may activate the reset signal RSTB to logic low when all the plurality of timing-compensated input signals IN_RE<0:3> have an inactivation level, for example, a logic low level.

The reset signal generation unit 603 may include first to third logic gates 631 to 633.

The first logic gate 631 may perform a logic NOR operation on the portions IN_RE<0:1> of the plurality of timing-compensated input signals IN_RE<0:3> and output the logic NOR operation result.

The second logic gate 632 may perform a logic NOR operation on the portions IN_RE<2:3> of the plurality of timing-compensated input signals IN_RE<0:3> and output the logic NOR operation result.

The third logic gate 633 may generate the reset signal RSTB by performing a logic NAND operation on an output of the first logic gate 631 and an output of the second logic gate 632.

Figure 9:
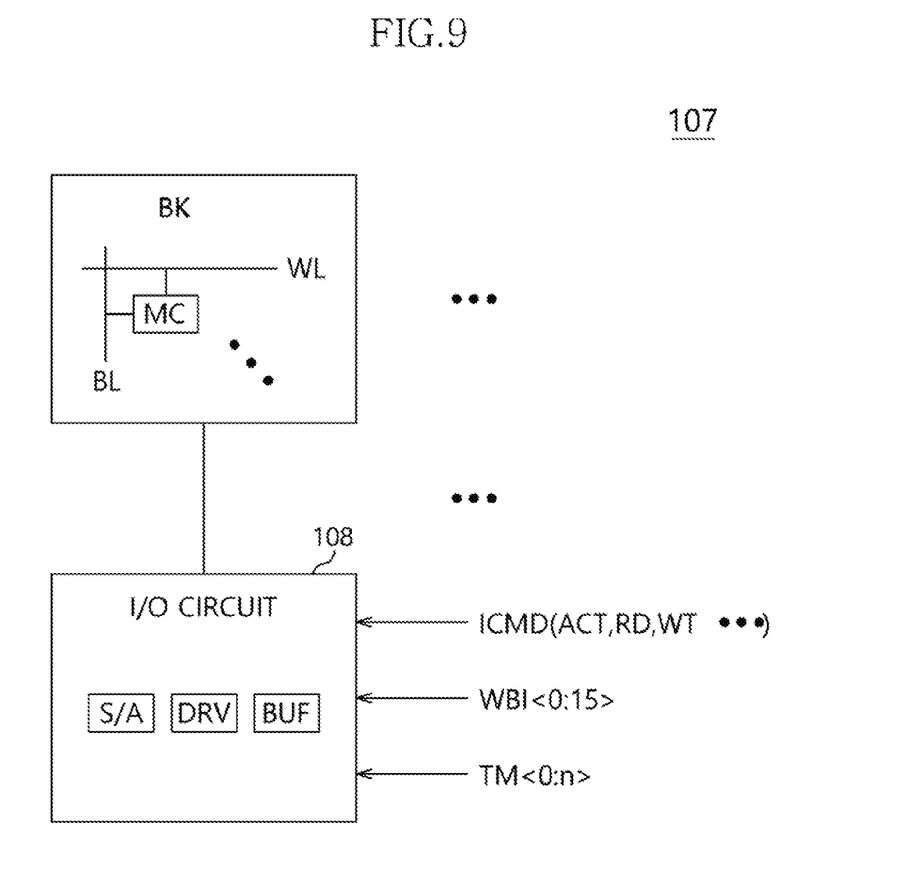
FIG. 9 is a diagram illustrating a representation of an example of a configuration of a memory block of FIG. 2.

Referring to FIG. 9, the memory block 107 of FIG. 2 may include a plurality of unit memory blocks, for example, memory banks BK and an input and output (I/O) circuit 108.

Each of the memory banks BK may include a plurality of memory cells MC coupled between word lines WL and bit lines BL.

The I/O circuit 108 may include various circuit components, for example, a sense amplifier S/A, a driver DRV, and a buffer BUF related to data I/O between the I/O pad unit 103 of FIG. 2 and the memory bank BK.

The I/O circuit 108 may perform the wafer burn-in test by controlling turn-on and turn off (turn-on/off) of the sense amplifier S/A, the driver DRV, and the buffer BUF according to the plurality of wafer burn-in signals WBI<0:15> generated in the command processing unit 105 of FIG. 2.

The wafer burn-in test may be a test which determines whether or not the semiconductor memory is normally operating by applying stress to the semiconductor memory through repetitive turn-on/off of the sense amplifier S/A, the driver DRV, the buffer BUF, and the like for a preset time.

The I/O circuit 108 may perform data I/O according to a normal operation mode based on the plurality of internal commands ICMD, for example, an active command ACT, a read command RD, a write command WT, and the like generated in the command processing unit 105 of FIG. 2.

The I/O circuit 108 may perform various tests other than the wafer burn-in test by entering various test modes related to data being written and read according to the plurality of test mode signals TM<0:n> generated in the command processing unit 105 of FIG. 2.

Figure 10:
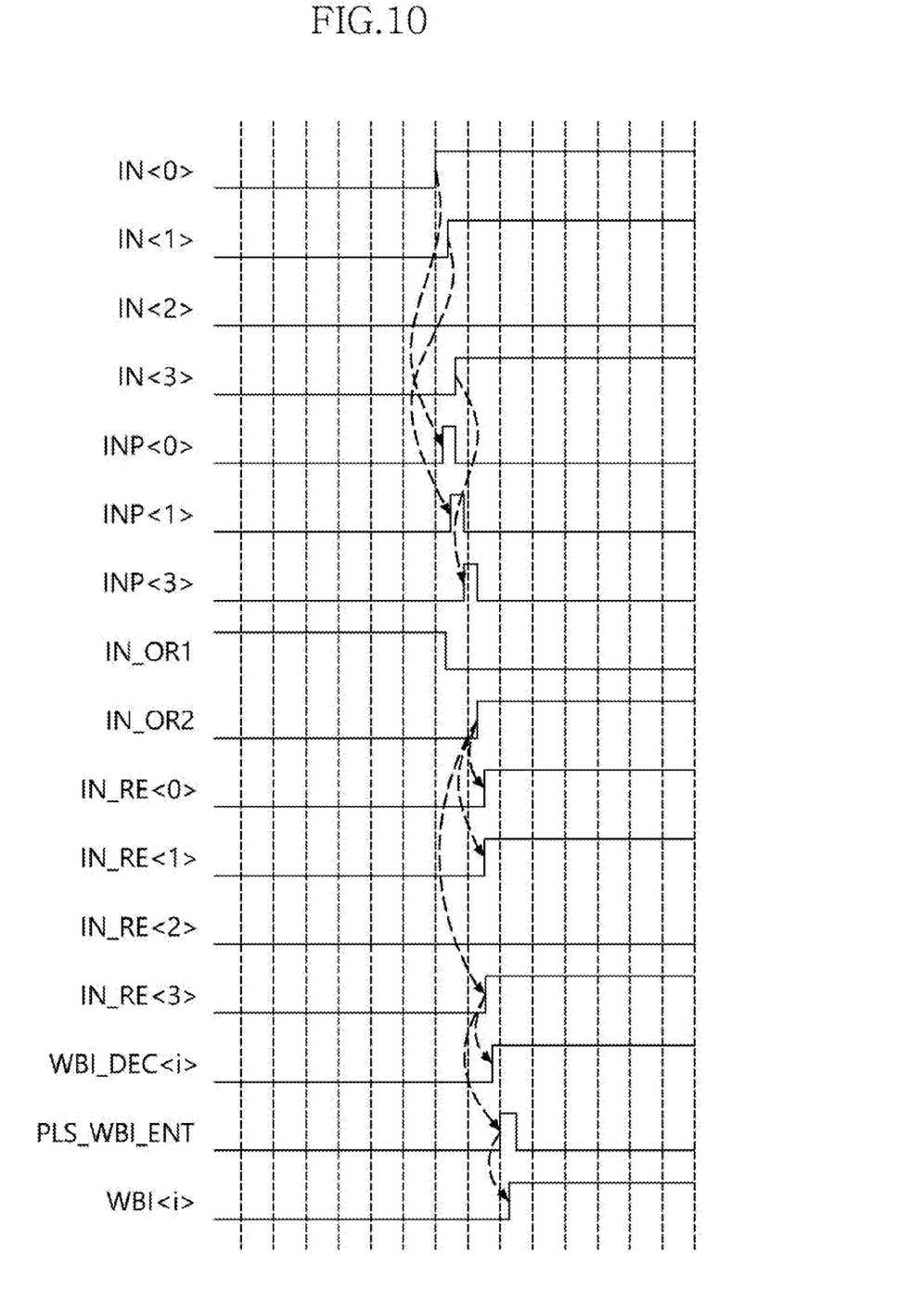
FIGS. 10 and 11 are examples of timing diagrams illustrating an operation of generating a wafer burn-in signal according to an embodiment of the disclosure.

An operation of generating the plurality of wafer burn-in signals WBI<0:15> will be described with reference to FIG. 10.

Skew between the plurality of input signals IN<0:3> may be caused in a process of transmitting the plurality of input signals IN<0:3> from the I/O pad unit 103 to the command processing unit 105 as illustrated in FIG. 2.

The timing correction unit 400 may generate the plurality of pulse signals INP<0:3> by detecting transitions of the plurality of input signals IN<0:3>.

The output signal IN_OR1 of the first combination circuit 402 of the timing correction unit 400 of FIG. 5 may be transited to a low level according to a pulse signal INP<0> having a fastest transition timing among the plurality of pulse signals INP<0:3>.

The output signal IN_OR2 of the second combination circuit 403 of the timing correction unit 400 of FIG. 5 may be transited to a high level according to a pulse signal INP<3> having a latest transition timing among the plurality of pulse signals INP<0:3>.

The timing correction unit 400 of FIG. 5 may generate the plurality of timing-compensated input signals IN_RE<0:3> by arranging the plurality of input signals IN<0:3> according to the output signal IN_OR2 of the second combination circuit 403.

The plurality of timing-compensated input signals IN_RE<0:3> may be decoded and any one WBI_DEC<i> among the plurality of decoding signals WBI_DEC<0:15> may be activated.

The mode entry signal PLS_WBI_ENT may be generated according to the plurality of timing-compensated input signals IN_RE<0:3>.

The decoding signal WBI_DEC<i> may be latched according to the mode entry signal PLS_WBI_ENT and any one WBI<i> among the plurality of wafer burn-in signals WBI<0:15> may be activated.

Figure 11:
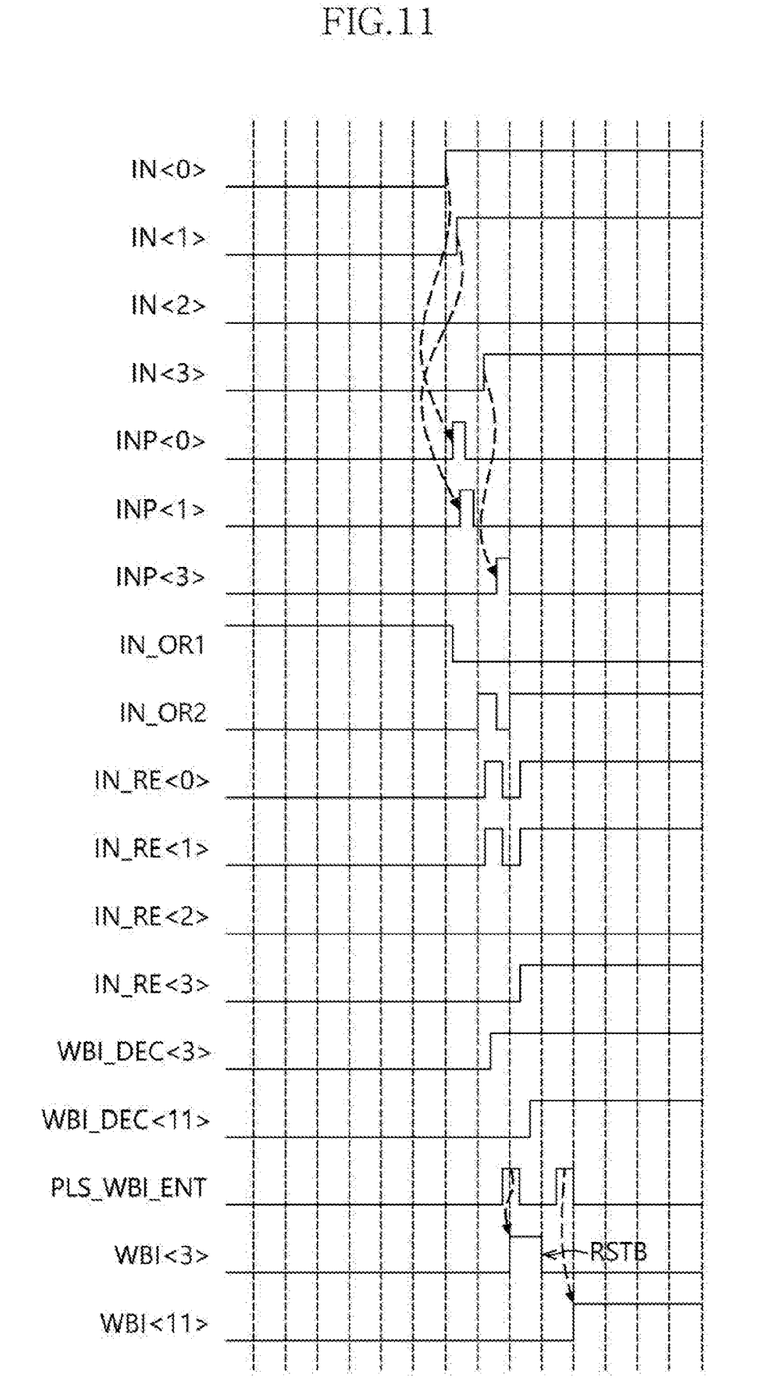

Another example of an operation of generating the plurality of wafer burn-in signals WBI<0:15> will be described with reference to FIG. 11.

Skew between the plurality of input signals IN<0:3> may be caused in a process of transmitting the plurality of input signals IN<0:3> from the I/O pad unit 103 to the command processing unit 105 as illustrated in FIG. 2.

When the skew between the plurality of input signals IN<0:3> has a value greater than a specific value, the plurality of timing-compensated input signals IN_RE<0:3> may have a plurality of activation periods.

Accordingly, the decoding signal WBI_DEC<3> among the plurality of decoding signals WBI_DEC<0:15> may also be unintentionally activated before the desired decoding signal WBI_DEC<11> is normally activated.

Two pulses in the mode entry signal PLS_WBI_ENT may also be generated according to the plurality of timing-compensated input signals IN_RE<0:3>.

The decoding signal WBI_DEC<3> may be latched according to a first pulse of the mode entry signal PLS_WBI_ENT and the wafer burn-in signal WBI<3> among the plurality of wafer burn-in signals WBI<0:15> may be first activated.

However, the wafer burn-in signal WBI<3> may be reset to a low level according to the reset signal RSTB generated according to the transitions of all the plurality of timing-compensated input signals IN_RE<0:3> to a low level in the reset signal generation unit 603.

The decoding signal WBI_DEC<11> may be latched according to a second pulse of the mode entry signal PLS_WBI_ENT and the wafer burn-in signal WBI<11> among the plurality of wafer burn-in signals WBI<0:15> may be normally activated.

As described above, in an embodiment, the plurality of wafer burn-in signals WBI<0:15> may be normally generated regardless of skew degree of the input signal.

The wafer burn-in test circuit and or semiconductor memory as discussed above (see FIGS. 1-11) are particular useful in the design of other memory devices, processors, and computer systems. For example, referring to FIG. 12, a block diagram of a system employing a wafer burn-in test circuit and or semiconductor memory in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 12:
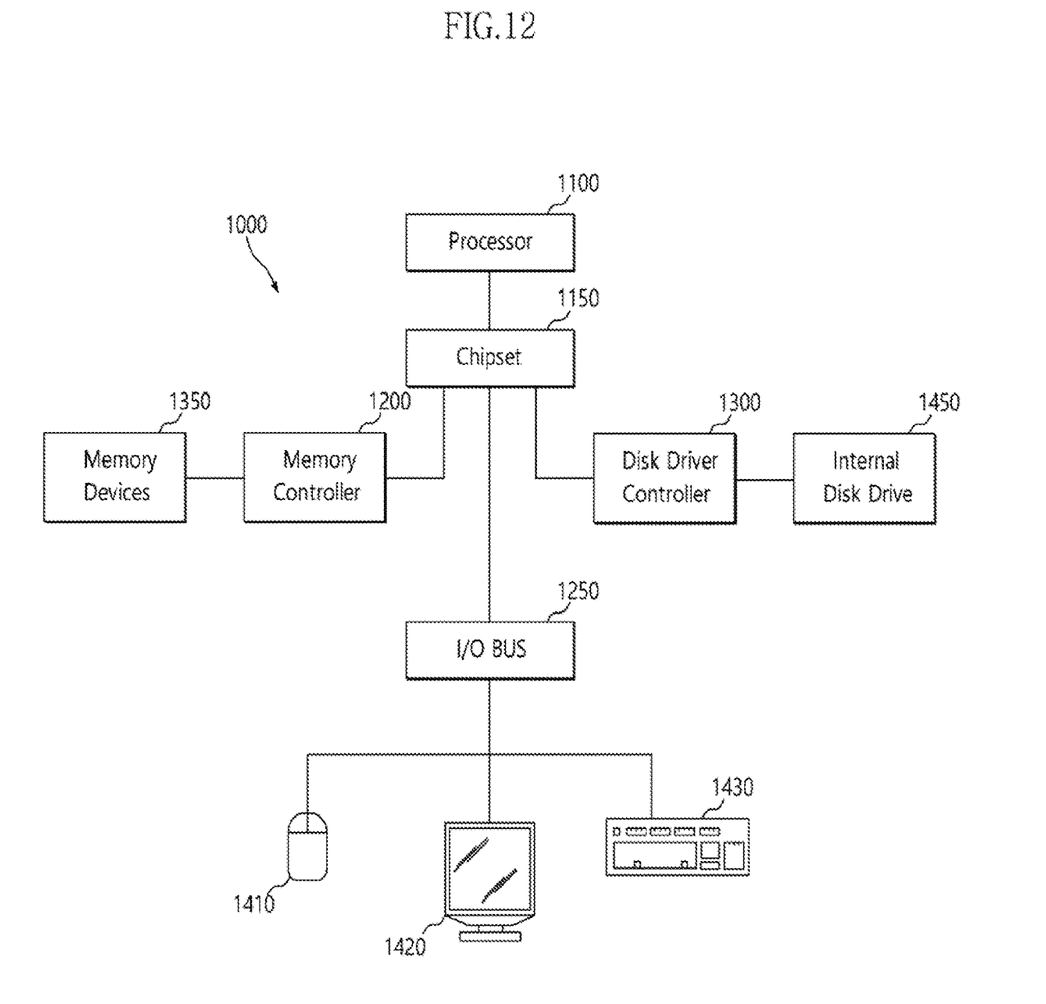
FIG. 12 illustrates a block diagram of an example of a representation of a system employing a wafer burn-in test circuit and or semiconductor memory with the various embodiments discussed above with relation to FIGS. 1-11.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one wafer burn-in test circuit and or semiconductor memory as discussed above with reference to FIGS. 1-11. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one wafer burn-in test circuit and or semiconductor memory as discussed above with relation to FIGS. 1-11, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 12 is merely one example of a wafer burn-in test circuit and or semiconductor memory as discussed above with relation to FIGS. 1-11. In alternate embodiments, such as, for example but not limited to, cellular phones or digital cameras, the components may differ from the embodiments illustrated in FIG. 12.

The above described embodiments of the present disclosure are intended to illustrate and not to limit the present disclosure. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A semiconductor memory comprising:
an input and output (I/O) pad unit;
a memory block including a plurality of unit memory blocks and an I/O circuit configured to perform a data I/O operation between the I/O pad unit and the plurality of unit memory blocks; and
a wafer burn in control unit configured to receive a portion of an address signal input through the I/O pad unit as a plurality of input signals and generate a plurality of wafer burn-in signals according to a plurality of timing-compensated input signals generated by arranging the plurality of input signals in conformity with an input signal having a latest transition timing among the plurality of input signals.

2. The semiconductor memory of claim 1, wherein the memory block is configured to perform a wafer burn-in test by controlling components of the I/O circuit according to the plurality of wafer burn-in signals.

3. The semiconductor memory of claim 1, wherein the memory block is configured to perform a wafer burn-in test by controlling turn-on and turn-off of a sense amplifier, a driver, or a buffer of the I/O circuit according to the plurality of wafer burn-in signals.

4. The semiconductor memory of claim 1, wherein the wafer burn-in control unit includes:
a timing correction unit configured to generate the plurality of timing-compensated input signals by synchronizing a plurality of pulse signals generated according to the plurality of input signals with the input signal having the latest transition timing among the plurality of input signals;
a mode entry signal generation unit configured to generate a mode entry signal according to the plurality of timing-compensated input signals; and
a wafer burn-in signal decoding unit configured to generate a plurality of decoding signals by decoding the plurality of timing-compensated input signals and output the plurality of decoding signals as the plurality of wafer burn-in signals by latching the plurality of decoding signals according to the mode entry signal.

5. The semiconductor memory of claim 4, wherein the wafer burn-in signal decoding unit is configured to initialize the plurality of wafer burn-in signals according to the plurality of timing-compensated input signals.

6. The semiconductor memory of claim 4, wherein the timing correction unit includes:
a plurality of pulse generators configured to generate the plurality of pulse signals by detecting transitions of the plurality of input signals;
a combination circuit configured to generate an output signal by combining the plurality of input signals and the plurality of pulse signals; and
an arrangement circuit configured to arrange the plurality of input signals according to the output signal of the combination circuit and output the arranged input signals as the plurality of timing-compensated input signals.

7. The semiconductor memory of claim 4, wherein the mode entry signal generation unit includes:
a combination circuit configured to generate a combination signal by combining the plurality of timing-compensated input signals; and
a pulse generator configured to generate the mode entry signal by detecting transition of the combination signal.

8. The semiconductor memory of claim 4, wherein the wafer burn-in signal decoding unit includes:
a plurality of decoders configured to generate the plurality of decoding signals by decoding the plurality of timing-compensated input signals; and
a plurality of latches configured to latch the plurality of decoding signals according to the mode entry signal and output latched decoding signals as the plurality of wafer burn-in signals.

9. The semiconductor memory of claim 8, wherein the wafer burn-in signal decoding unit further includes:
a reset signal generation unit configured to activate a reset signal based on the plurality of timing-compensated input signals,
wherein the plurality of latches are configured to initialize logic levels of the plurality of wafer burn-in signals based on the reset signal.

10. The semiconductor memory of claim 1, further comprising a test mode decoder configured to generate a plurality of test mode signals for performing various tests other than the wafer burn-in test by entering various test modes related to data being written and read according to the address signal.

11. The semiconductor memory of claim 1, further comprising a command decoder configured to generate internal commands including a read command and a write command according to the address signal.

* * * * *